Oct. 24, 1967 P. A. JOHNSON 3,348,405

TRANSISTOR LEAD-FORMING TOOL

Filed Feb. 26, 1965

INVENTOR:
Phillip A. Johnson

By Stephen J. King
Attorney

United States Patent Office 3,348,405
Patented Oct. 24, 1967

3,348,405
TRANSISTOR LEAD-FORMING TOOL

Phillip Allan Johnson, Sylmar, Calif., assignor to Litton Systems, Inc., Beverly Hills, Calif.

Filed Feb. 26, 1965, Ser. No. 435,445
1 Claim. (Cl. 72—325)

ABSTRACT OF THE DISCLOSURE

A tool, having mating jaws wherebetween the mating jaws are complementary substantially right angle bending surfaces and a cutting edge, for preforming elongated metal terminals and for simultaneously cutting the terminals to a desired length.

This invention relates to a tool utilized in manufacturing transistor circuitry and, more particularly, to a transistor lead-forming tool.

The utility of transistors in modern electronics is well known. Transistors save space and power in the circuitry in which they are used. The small size of transistors, however, creates a number of problems in the various manufacturing processes for transistorized circuitry.

For example, in most circuitry the number of transistors is too small and the variety of positions too great to make mechanized assembly economically feasible. Most of the assembly must be done by hand. However, transistors are normally so small that they are difficult devices with which to work. The positioning of such devices by hand, the soldering, and other manipulative processes are often quite complicated and time consuming.

In assembling transistor circuitry, it is quite normal to mount the transistor leads to soldered connections on a circuit board. In order to enhance the structural stability of the mounting and provide shielding, the leads are normally fed through holes in the circuit board and are attached to soldered connections at the other side. It is a usual practice to bend the leads at right angles so that legs are formed in the leads for maintaining the body of the transistor above the board. These legs formed by bends in the leads bear on the circuit board and cushion against the transmission of most shocks between the transistor and the soldered connections. This practice eliminates a substantial cause of failures in the soldered connections.

The bending of the leads is quite complicated and takes a substantial amount of time. The height of the transistor above the board and the spread of the transistor leads to intersect the holes in the circuit board are often quite precise measurements. Assembly, therefore, normally requires reworking of original estimated tolerances by the assembler. This reworking often causes the leads to break during the assembly process, increasing cost and time substantially; it may also lead to subsequent circuit failures. Thus, the normal assembly process is very time consuming (and thus costly in a labor sense), tends to reduce the accuracy with which the assembly is accomplished, and in general degrades the reliability of the circuit assembly.

Another difficulty encountered in assembling transistor circuitry is involved in correctly positioning the transistors. Often, the transistor leads are soldered in a "first try" position from which they must be removed and resoldered in a final position. Quite obviously, this additional step costs a substantial amount of time and attendant labor.

It is therefore a primary object of this invention to reduce the cost and time expended in the assembly of transistor circuitry by mechanizing the process by which transistor leads are formed for mounting to a circuit board.

Another object of this invention is to increase the accuracy with which transistor leads are bent and cut to shape for mounting to circuit boards in the manufacturing process.

An additional object of this invention is to reduce the cost of transistor circuitry.

Another object of this invention is to speed the manufacture of transistor circuitry by providing a tool for preforming transistor leads (terminals).

These and other objects are realized in accordance with the invention by a transistor lead-forming tool which bends the individual transistor leads into a shape appropriate for immediate mounting to a circuit board. The shape is such and the accuracy of the bending or crimping is such that the transistors are caused to sit by themselves in an accurate position without initial soldering. No tolerance problems are realized utilizing the tool of this invention. The tool is so useful in accurately bending transistor terminals that the process of mounting a transistor to a circuit board is reduced to less than one-tenth of that normally required for individual mounting without the use of the tool. An additional advantage which accrues through the use of the tool of this invention is a reduction in material costs through the elimination of breakage caused by stressing of transistor leads by multiple estimation bends. The elimination of estimation bends also enhances the reliability of the circuitry manufactured.

The invention and the features thereof by which these desirable objects are accomplished will be better understood from the following specific description together with the drawings in which.

Figure 1:
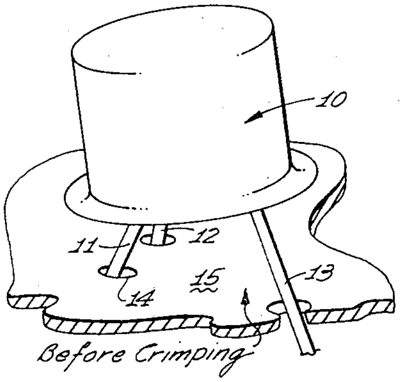
FIGURE 1 is a perspective view of a process by which an individual transistor might be mounted to a circuit board by hand.
Figure 4:
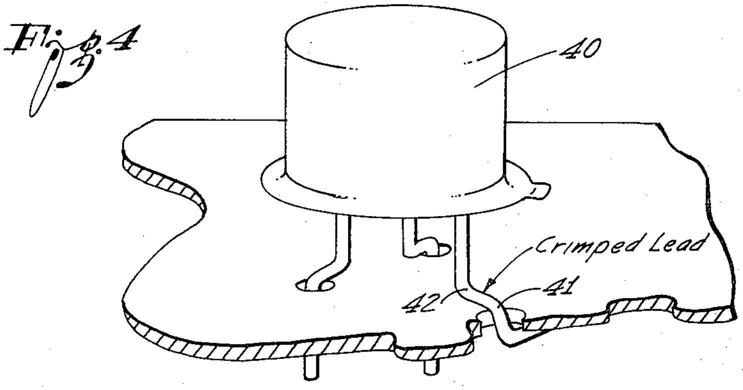
FIGURE 4 is a perspective view of a transistor which has its leads crimped and bent in accordance with the tool disclosed in FIGURES 2 and 3.
Figure 2:
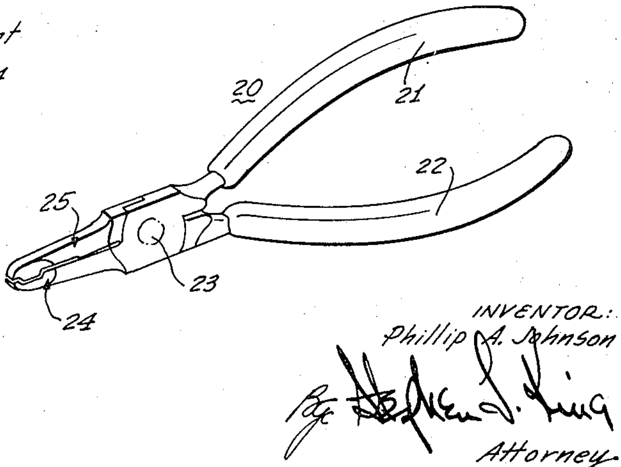
FIGURE 2 is a perspective view of a transistor lead-forming tool in accordance with the invention.

In FIGURE 1 is shown an enlarged perspective view of a transistor 10 in the process of being mounted by hand to a circuit board. The transistor 10 of FIGURE 1 has leads (conductors, connectors, or terminals) 11, 12, and 13 positioned within holes 14 in a circuit board 15. A number of problems are obvious from FIGURE 1. For example, the transistor 10, if it is to be positioned at an accurate height above the circuit board 15, must in some way be physically mounted thereabove before the leads 11, 12, and 13 are soldered below the board. This often requires a first soldering, a measurement, an unsoldering, and a "final position" soldering. Furthermore, in the position in which the transistor 10 is shown, any shock to the transistor casing will cause a like shock to be applied to the soldered connections (not shown) finally made to the board 15. The shock problem and the problem of accurately positioning the transistor 10 above the board 15 are normally cured by crimping or bending the transistor leads as illustrated in FIGURE 4. The crimp provides for the transistor a positioning leg which bears on the circuit board and cushions the connections from physical shocks to the transistor.

Another problem readily apparent from FIGURE 1 is that of causing the leads 11, 12, 13 to protrude through the holes 14 without a great amount of bending and reworking. This problem becomes paramount when the crimped legs shown in FIGURE 4 are provided. Quite obviously, the bending necessary to position the leads within the holes 14 and to provide the crimped legs consumes a substantial amount of time and effort on the part of the assembler.

To eliminate this time consuming hand labor, a tool 20 is provided for automatically and accuratey accomplishing the crimping of the transistor leads. The tool 20 is a plier-like tool having a pair of handles 21 and 22 constructed of tool steel or other material known in the art from which such hand tools are normally manufactured. The handles are mounted to each other by a pivot 23. The tool 20 has a pair of jaws 24 and 25 connected, respectively, to the handles 21 and 22 so that movement of the latter about the pivot 23 causes the jaws 24 and 25 to approach and regress from one another. The jaws 24 and 25 are likewise formed of materials well known in the art from which hand tools are normally constructed. The processes by which manufacture of the tool itself is accomplished are unimportant to this invention which relates to the actual shape and formation of the tool itself and, for that reason, will not be discussed further herein.

Figure 3:
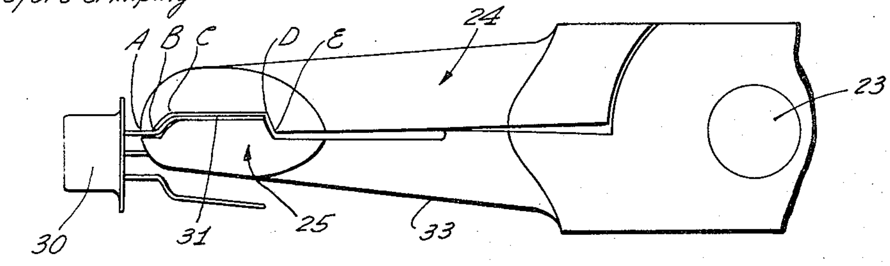
FIGURE 3 is an enlarged, partial, side view of the tool of FIGURE 2 shown with a transistor lead inserted between the jaws of the tool for forming.

The jaws 24 and 25 have mating surfaces, better shown in FIGURE 3, which are appropriately dimensioned and shaped in a pattern to crimp the leads of a particular transistor for a particular circuit board. A number of points have been delineated on the jaw 24 of the tool 20 of FIGURE 3 for illustration purposes. (Points A, B, C, D, and E seen in the side view are lines which are essentially parallel on the tool itself.) Between a first point A and a second point B, a plane surface is formed on the jaw 24. Between the point B and the point C, a second substantially flat plane at an angle to the first is formed. A third plane lies between the points C and D; this third plane is parallel to the first plane. A fourth plane lies on the lower surface of the jaw 24 between the points D and E, almost perpendicular to the third plane. Certain of the surfaces may be slightly rounded rather than planar. The jaw 25 has surfaces which mate with those of the jaw 24.

As may be seen in FIGURE 3, when a transistor 30 has a lead 31 inserted between the jaws 24 and 25, mating surfaces on the jaws 24 and 25 form the lead in such a manner as to provide the appropriate crimped shape for assembly of the transistor to a circuit board. Actually, the straight transistor lead 31 is measured and cut to an exact length and then inserted between the jaws 24 and 25 to the point where its end abuts on the plane between points D and E of the jaw 24. This accurately positions the lead 31 so that it will be bent at an appropriate position in accordance with the tolerances desired. The jaws are then brought together by causing the handles 21 and 22 to approach each other about the pivot 23. A stop 33 is provided on the jaw 25 so that the jaws 24 and 25 cannot completely mate upon one another but must remain apart a sufficient distance for the lead 31 to be bent without being maimed. Normally, this is the thickness of the transistor lead 31. In one particular tool constructed in accordance with the invention, the jaws 24 and 25 were allowed to approach each other until they reached a distance of 0.023 inch at which the stop 33 on the jaw 25 contacted the opposite face of the jaw 24. In this particular tool, the distance between the points A and B was 0.035 inch, the distance between the points A and C measured parallel to the plane of the surface between the points A and B was 0.060 inch, and the distance between points C and D was 0.220 inch.

Once the lead 31 and its associated leads have been bent to the appropriate position, the transistor leads may be inserted (see FIGURE 4) through holes in the circuit board to place the transistor 40 in a position which is appropriate for fixation to the board. In FIGURE 4, one lead 41 is shown as having been cut and bent (after the crimping process) into position for soldering. It is apparent from FIGURE 4 that the legs formed by the bend at point 42 (clamped between points B and C on the tool) provide appropriate positioning and facilitate cushioning of the transistor 40.

Figure 5:
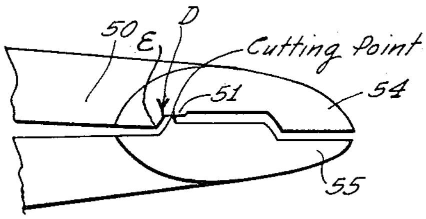
FIGURE 5 is a partial, side view of another tool in accordance with the invention.

It was first thought that a cutter might be provided between the jaws at the position illustrated by point D in FIGURE 3 to accurately trim the transistor leads and eliminate one step from the manufacturing process. However, it was determined that this caused a stretching of the lead and an attendant possibility of failure when the basic tool was used. However, a particular tool which allows the cutting has been devised. This tool 50 (shown in FIGURE 5) has a holding notch 51 closely adjacent and to the right of point D so that the transistor lead does not have any pressure exerted on it other than at the holding notch 51 at which the cutting would be accomplished and at the places where bends are accomplished. Essentially, the lead would be lightly bent and loosely maintained within the jaws 54 and 55 while the cutting was accomplished. This would negate a stressing of the lead.

Quite obviously, the tool would have to be adapted to the particular transistor and the particular positioning desired. However, where a large number of circuits are to be manufactured, the cost would be minuscule as compared to the cost of the labor required for individual hand shaping of the transistor leads. In addition, the hand-shaped leads are not as reliable as those formed by the tool of this invention since they are often worked close to the point of breakage. The tool-formed leads on the other hand are bent but once with minimal working or stressing. Thus, the manufacturing process is shortened; and the reliability of the circuitry is increased.

It might also be desirable and feasible in particular situations to utilize a mechanized tool rather than a hand tool such as that shown in the figures. Where the tool is substantially identical to that illustrated, yet the movement of the jaws is accomplished by mechanical means rather than by hand, the tool would fall within the scope of the invention. For example, a plurality of jaws would be within the invention. Other forms might be devised for particular transistors. The invention should be limited only within the scope of the appended claim since those skilled in the art will be able to devise many arrangements substantially akin to those disclosed without departing from the spirit and scope of the invention.

What is claimed is:

A tool for crimping and simultaneously cutting the terminals of transistors comprising:

a pair of mating jaws, said jaws having mating surfaces being shaped so that when the jaws are mated the surfaces thereof provide a pair of adjacent substantially right angle bends in a bendable wire inserted between the jaws;

a stop on one of said mating surfaces for correctly positioning a transistor terminal inserted between the jaws;

a cutter fixed to one of said jaws for determining the length of the terminal so inserted, said cutter including a holding notch on the other of said pair of jaws opposite the cutting edge of said cutter; and means for moving said jaws to mate with and to regress from one another.

References Cited

UNITED STATES PATENTS

| | | | |
|---|---|---|---|
| 1,290,331 | 1/1919 | Partlow | 72—409 X |
| 1,409,835 | 3/1922 | Doble | 72—409 X |
| 1,792,837 | 2/1931 | Harrison | 72—409 X |
| 1,887,732 | 11/1932 | Pagel et al. | 72—324 X |
| 2,625,067 | 1/1953 | Stone et al. | 72—409 |
| 2,732,744 | 1/1956 | Kuchman et al. | 72—409 X |
| 2,811,065 | 10/1957 | Johnson | 72—409 |
| 3,244,201 | 4/1966 | Wallshein | 72—409 |

CHARLES W. LANHAM, *Primary Examiner.*

E. SUTTON, *Assistant Examiner.*